United States Patent [19]

Lev

[11] Patent Number: 4,821,239

[45] Date of Patent: Apr. 11, 1989

[54] PROGRAMMABLE SENSE AMPLIFIER FOR READ ONLY MEMORY

[75] Inventor: Lavi A. Lev, Jerusalem, Israel

[73] Assignee: National Semiconductor Corp., Santa Clara, Calif.

[21] Appl. No.: 89,681

[22] Filed: Aug. 25, 1987

[51] Int. Cl.$^4$ .............................................. G11C 7/00
[52] U.S. Cl. .................................. 365/205; 365/207; 307/530
[58] Field of Search ................ 307/530; 365/205, 207, 365/189, 203, 96, 94

[56] References Cited

U.S. PATENT DOCUMENTS 4,367,540  1/1983  Shimohigashi ...................... 365/207

*Primary Examiner*—Joseph A. Popek
*Attorney, Agent, or Firm*—Limbach, Limbach & Sutton

[57] ABSTRACT

A programmable sense amplifier in accordance with the present invention includes an input multiplexer which receives a plurality of data input signals from the column lines of a ROM and provides a selected one of a data input signals as a data output signal based on control signals proviced to the input multiplexer. The voltage level of the data output signal corresponds to the number of 1's contained in the selected column line. A sensing stage receives the data output signal and amplifies it. The amplified signal is then provided to an XOR gate which either does or does not invert the amplified signal, based upon the state of the select node to which one of the XOR gate inputs is connected. The state of the select node is determined by a programmable internal multiplexer. The internal multiplexer comprises a number of FET switching transistors corresponding to the number of data input signals. Each of the switching transistors has one of its electrode areas commonly-connected to the select node. The other area of each switching transistor is selectively, i.e. programmably, connected either to the negative supply $V_{SS}$ or the positive supply $V_{CC}$ depending upon whether or not, respectively, a number of "1"s contained in the selected column line exceeds one-half the total number of row lines of the ROM, the 1s and 0s in the selected column line having been inverted if this is the case. Thus, the select mode will be appropriately charged or discharged because the XOR gate to produce the correct sense amplifier output.

2 Claims, 4 Drawing Sheets

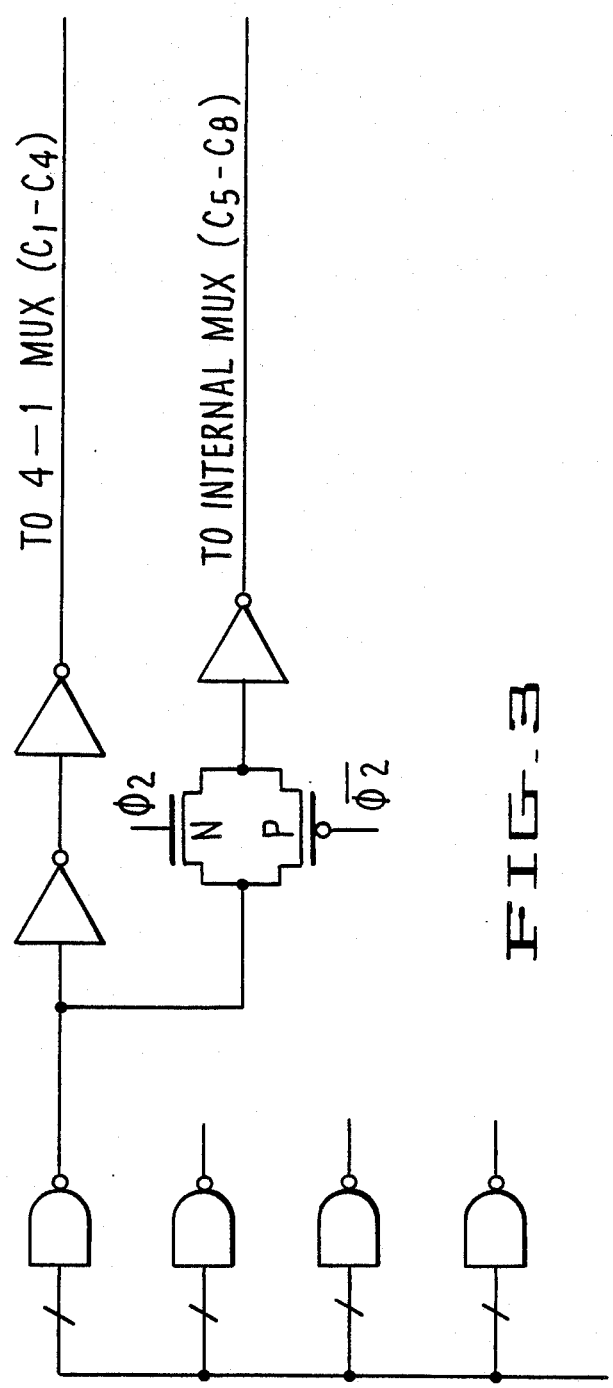
FIG_3
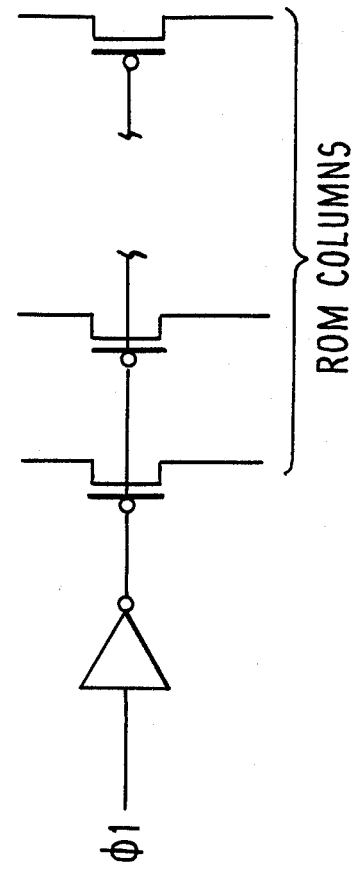
FIG_4

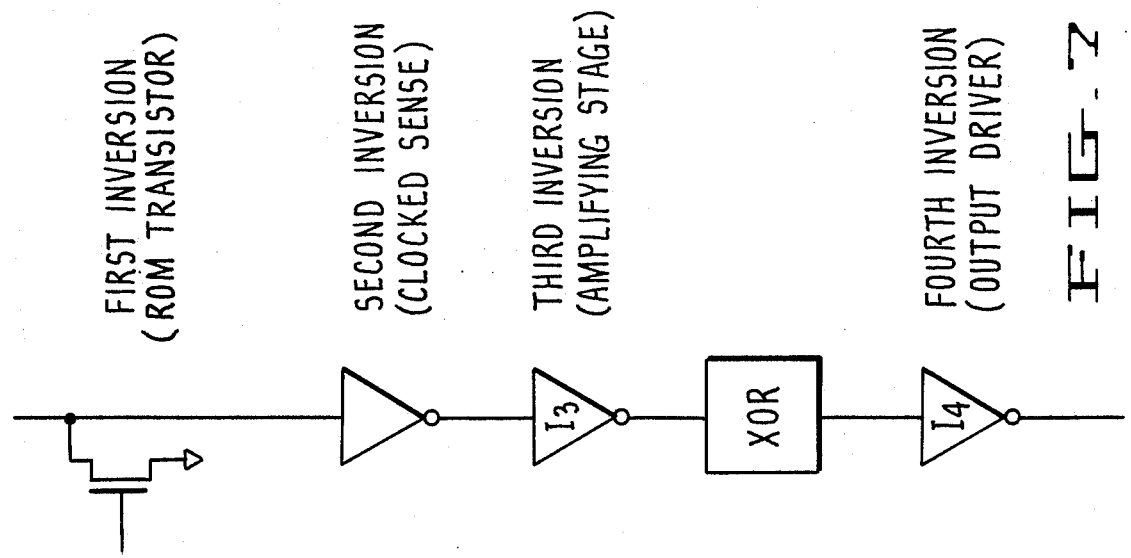
FIG. 7
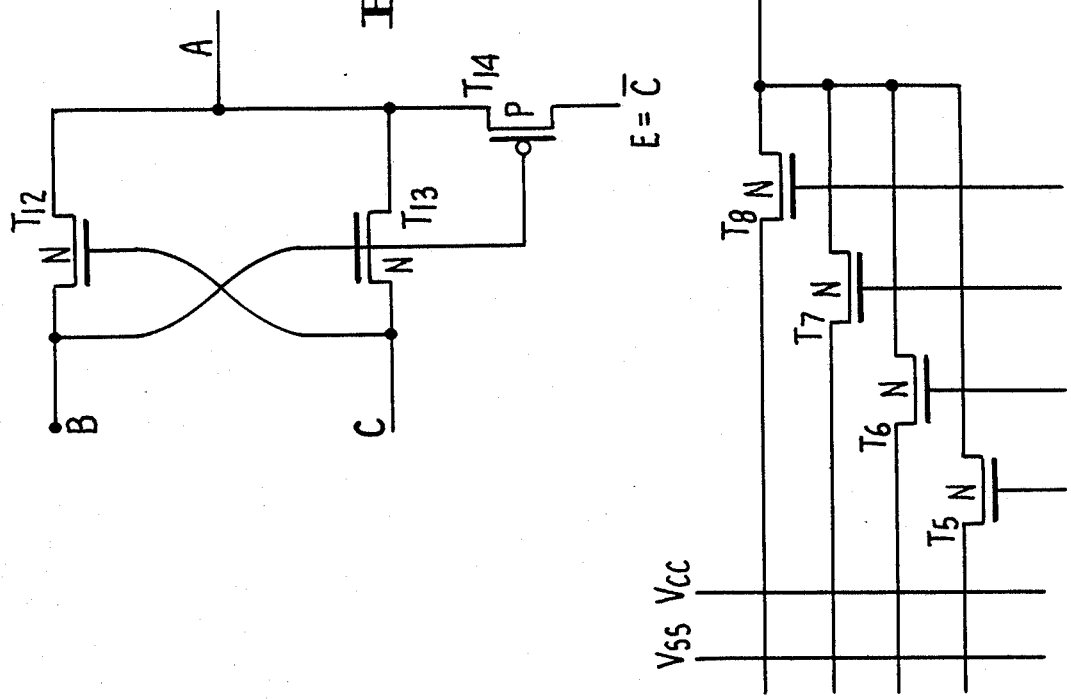
FIG. 5
FIG. 6

PROGRAMMABLE SENSE AMPLIFIER FOR READ ONLY MEMORY

BACKGROUND OF THE INVENTION

1. Field of the Invention

The present invention relates to sense amplifiers for integrated circuit memory devices and, in particular, to a programmable sense amplifier which enables large voltage swings in read only memories.

2. Discussion of the Prior Art

A read only memory (ROM) is a widely used integrated circuit device for storing digital information. Data is maintained in a ROM in the form of binary "1"s and "0"s stored in memory cells located at each intersection of the ROM's row lines and column lines. Data stored in the columns of a selected row constitutes a "word". The input signal to the ROM addresses a "word" through an address decoder. The appearance of a "0" in a retrieved word causes the ROM voltage to remain high, i.e. unchanged. The appearance of a "1" in a retrieved word causes the ROM voltage to decrease. The voltage decrease is detected by the sense amplifier which then provides the ROM output.

The most popular approach to ROM sense amplifier design is to build and tune circuits that are sensitive to the minimum expected voltage swing in a given ROM. This is known as "precision tuning". The value of the minimum expected voltage swing in a ROM is inversely proportional to the number of "1"s stored in a given column of the ROM, where the maximum possible number of "1"s in the column is equal to the number of rows in the ROM. The actual load on the sense amplifier determines the values to be used in sizing the different transistors comprising the sense amplifier. These values are determined after a long, detailed simulation process utilizing computer aided design (CAD) techniques.

If there are many rows in the ROM, the worst case voltage swing will be very small. Thus, a very sensitive circuit must be designed in order to accurately sense this change.

There are several problems associated with sensitive circuits of this type. If a word in the ROM contains a "0" in one of its bits, then the voltage level of this bit line when this word is chosen must remain "HIGH". If noise from other bit lines that are discharged at this time, or from power lines, is introduced into this bit line through parasitic coupling capacitors, the sense amplifier that is connected to this bit line might sense it and produce a wrong output. Since it is extremely difficult to predict and model the noise to be expected in a particular ROM and sense amplifier layout, the design of noise-immune, sensitive sense amplifiers is correspondingly difficult.

Also, the voltage swing itself may be smaller than expected due to process variables. For example, the diffusion capacitance can be higher than expected due to fluctuations in the implant step in the fabrication of the device. Similarly, the drive capability of the discharging transistors that comprise the "1"s in the ROM locations may be smaller than expected. This can result from a wide variety of causes, such as changes in transistor threshold voltage, mobility reduction and temperature effects.

Because of these unpredictable problems, even after many CAD iterations, the manufactured sense amplifier circuit design might not work in a particular application. If the problem is noise, an additional tuning step is required. If the problem is a smaller than expected voltage swing, then a larger discharge time will be required for the transistor to produce the desired voltage swing; this results in frequency reduction. In both cases, if the ROM must operate within a given frequency, a redesign of the device is required with no guarantee that the redesign will operate within a desired specification.

For the reasons stated above, sense amplifier design is known to present one of the most complicated and problematic elements of memory design.

SUMMARY OF THE INVENTION

The present invention provides a programmable sense amplifier which is designed to enable large voltage swings in ROMs. It provides three primary benefits over conventional sense amplifier designs. First, its design phase is short and simple. Second, its sensing technique is less complex than that of conventional sense amplifiers. Third, one circuit, with minor modifications, can be used in a wide variety of ROMs.

A programmable sense amplifier in accordance with the present invention includes an input multiplexer which receives a plurality of data input signals from the column lines of a ROM. The input multiplexer provides a selected one of the data input signals as a data output signal based on control signals provided to it by an address decoder. The voltage level of the data output signal corresponds to the number of "1"s contained in the column line selected by the address decoder. A sensing stage receives the data output signal and amplifies it. The amplified signal is then provided to an XOR gate which either does or does not invert the amplified signal, based upon the state of a select node to which one of the XOR gate inputs is connected. The state of the select node is determined by a programmable internal multiplexer. The internal multiplexer comprises a number of FET switching devices corresponding to the number of data input signals. Each of the switching transistors has one of its source/drain areas commonly connected to the select node. The other source/drain area of each switching transistor is selectively, i.e. programmably, connected either to the $V_{SS}$ negative supply or the $V_{CC}$ positive supply, depending upon whether or not, respectively, the number of "1"s contained in the selected column line exceeds one-half the total number of row lines in the ROM. If the number of "1"s in the selected column does exceed one-half of the total number of row lines, then the "1"s and "0"s in the selected column line are inverted. Thus, the select node is appropriately charged or discharged to cause the XOR gate to produce the correct sense amplifier output.

The programmable sense amplifier of the present invention has the following unique features. It is programmed by inserting a contact in layout. This, as stated above, enables the user to insure that the maximum number of "1"s in any ROM column never exceeds one-half of the possible maximum. Second, the programming facility enables the sense amplifier to sense large voltage swings in a particular ROM. This is accomplished by inverting the column's contents whenever the number of "1"s exceeds one-half of the total number of rows and by programming the sense amplifier accordingly to produce the correct output. Third, it enables the programming of individual inputs when a single sense amplifier is connected to several inputs through a multiplexer.

The result is a programmable sense amplifier that is particularly suited for automatic ROM generation with computer aided design (CAD) tools. Furthermore, large voltage swings in the associated ROM are easily sensed and operating frequency of the ROM is increased, while changes in ROM content do not affect operating frequency.

These and other features and advantages of the programmable sense amplifier of the present invention will become apparent and be appreciated by reference to the detailed description of a preferred embodiment of the invention provided below which should be considered in conjunction with the accompanying drawings.

BRIEF DESCRIPTION OF THE DRAWINGS

FIG. 3 is a schematic diagram illustrating the creation of the control signals utilized in the programmable sense amplifier shown in FIG. 1.

FIG. 4 is a schematic diagram illustrating the connection of the phase $\phi 1$ clock signal to the column lines of a ROM.

FIG. 5 is a schematic diagram illustrating the XOR gate of the sense amplifier shown in FIG. 1.

FIG. 6 is a schematic diagram illustrating the programmable internal multiplexer of the sense amplifier shown in FIG. 1.

FIG. 7 is a schematic diagram illustrating the inversion stages of a ROM transistor and the sense amplifier shown in FIG. 1.

DETAILED DESCRIPTION OF THE INVENTION

Figure 1:
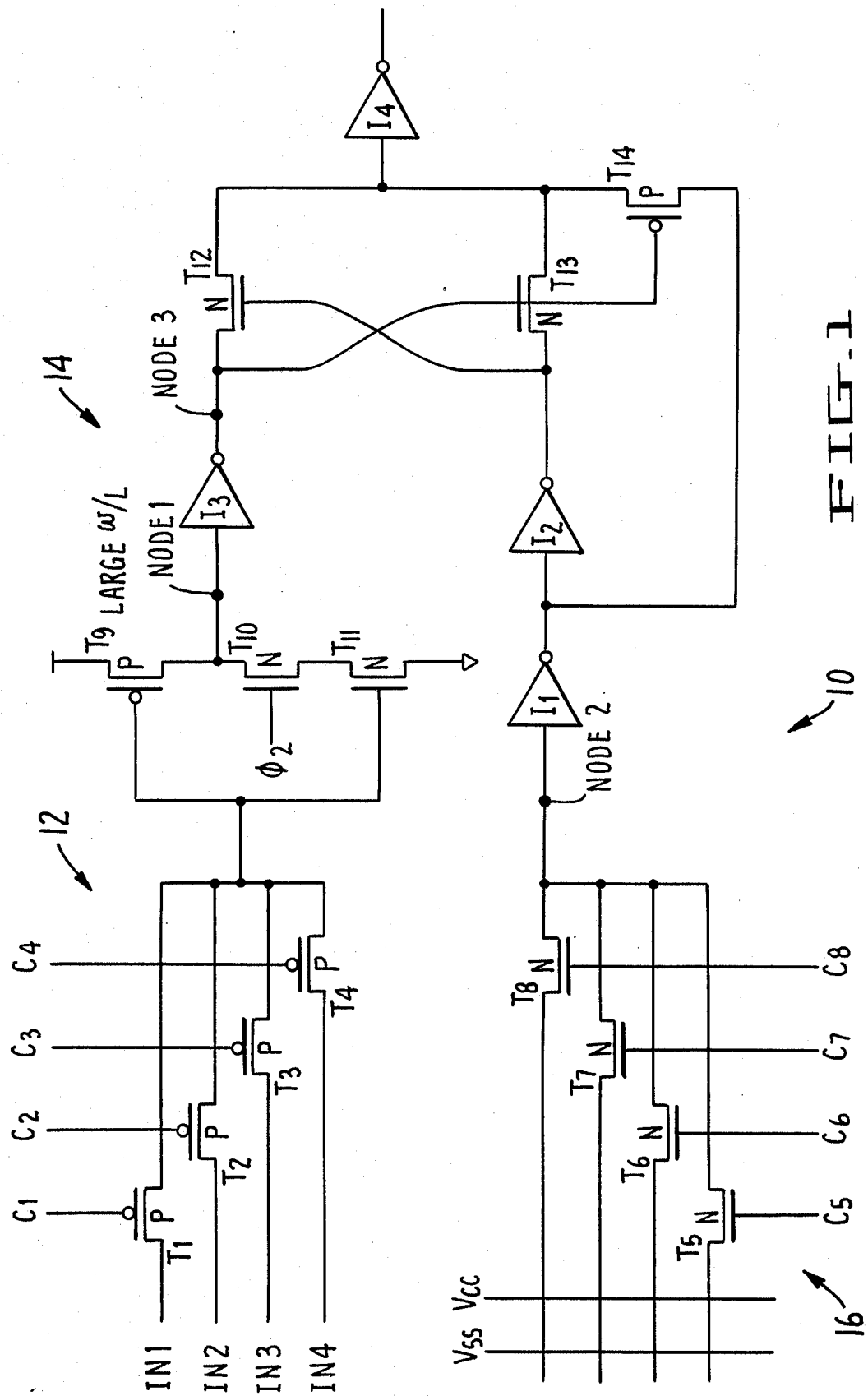
FIG. 1 is a schematic diagram illustrating an embodiment of a programmable sense amplifier in accordance with the present invention.

An embodiment of a programmable sense amplifier in accordance with the present invention is shown schematically in FIG. 1.

In order to reduce bit line capacitance, ROMs are typically designed in a "folded" configuration. For example, if a ROM having 1024 rows with 40 bits in a row is required, it can be implemented as 256 rows with 160 bits in a row. After this "folding", each row includes four "interleaved" words. Therefore, in addition to sense/amplification circuitry, a multiplexer circuit must be included in the sense amplifier design to select which of the four words will enter the sense amplifier. This multiplexer, in the example described above and as shown in FIG. 1, will have four inputs, one output and four control signals. The control signals, which are produced by a ROM address decoder, determine which of the inputs will appear as the multiplexer output.

As shown in FIG. 1, a programmable sense amplifier 10 is connected to receive four data input signals IN-1-IN4 through an input multiplexer 12. The input signals IN1-IN4 are the column lines of a ROM, as explained above. The multiplexer 12 consists of four P-channel transistors T1-T4 which provide a selected one of the data input signals IN1-IN4 as a data output signal based on control signals C1-C4.

The sensing stage 14 of the programmable sense amplifier 10 includes P-channel transistor T9 and N-channel transistors T10 and T11. The sensing stage 14 forms a clocked inverter that utilizes transistors T9 and T10 to sample the data output signal provided by the input multiplexer 12. Inverter I3 amplifies the sampled signal at Node 1 and feeds a NOT XOR gate which, as illustrated in FIG. 1, includes N-channel transistors T12 and T13 and P-channel transistor T14. Since transistor T9 must be more sensitive to voltage decreases, its width "w" is increased. When transistor T9 senses a voltage decrease in its gate, it charges Node 1. Therefore, inverter I3 must be more sensitive to a voltage rise at its input. This is achieved by making its "N" much stronger than its "P".

N-channel switching transistors T5–T8 are connected as a programmable internal multiplexer 16. In accordance with the present invention, each of the switching transistor T5–T8 has one of its source/drain areas commonly-connected to a select node, i.e. Node 2 in FIG. 1. The other source/drain area of each switching transistor T5–T8 is selectively connected either to the $V_{CC}$ positive supply or the $V_{SS}$ negative supply, depending upon the number of "1"s contained in the selected column line. If the number of "1"s in the selected column line is less than one-half of the total number of row lines in the ROM, then the switching transistor is connected to the $V_{CC}$ positive supply. If the number of "1"s in the selected column line exceeds one-half the total number of row lines in the ROM, then the switching transistor is connected to the $V_{SS}$ negative supply and the "1"s and "0"s in the selected column line are inverted. Thus, internal multiplexer 16 is selectively, i.e. programmably, connected to either a positive supply voltage $V_{CC}$ or to a negative supply voltage $V_{SS}$, where in the illustrated embodiment $V_{CC}=5$ V and $V_{SS}=0$ V. The programmable internal multiplexer 16 is used to program the XOR gate to act as an inverter or to follow the signal produced by inverter I3, as explained in greater detail below.

Invertor I4 drives an output load (not shown).

Figure 2:
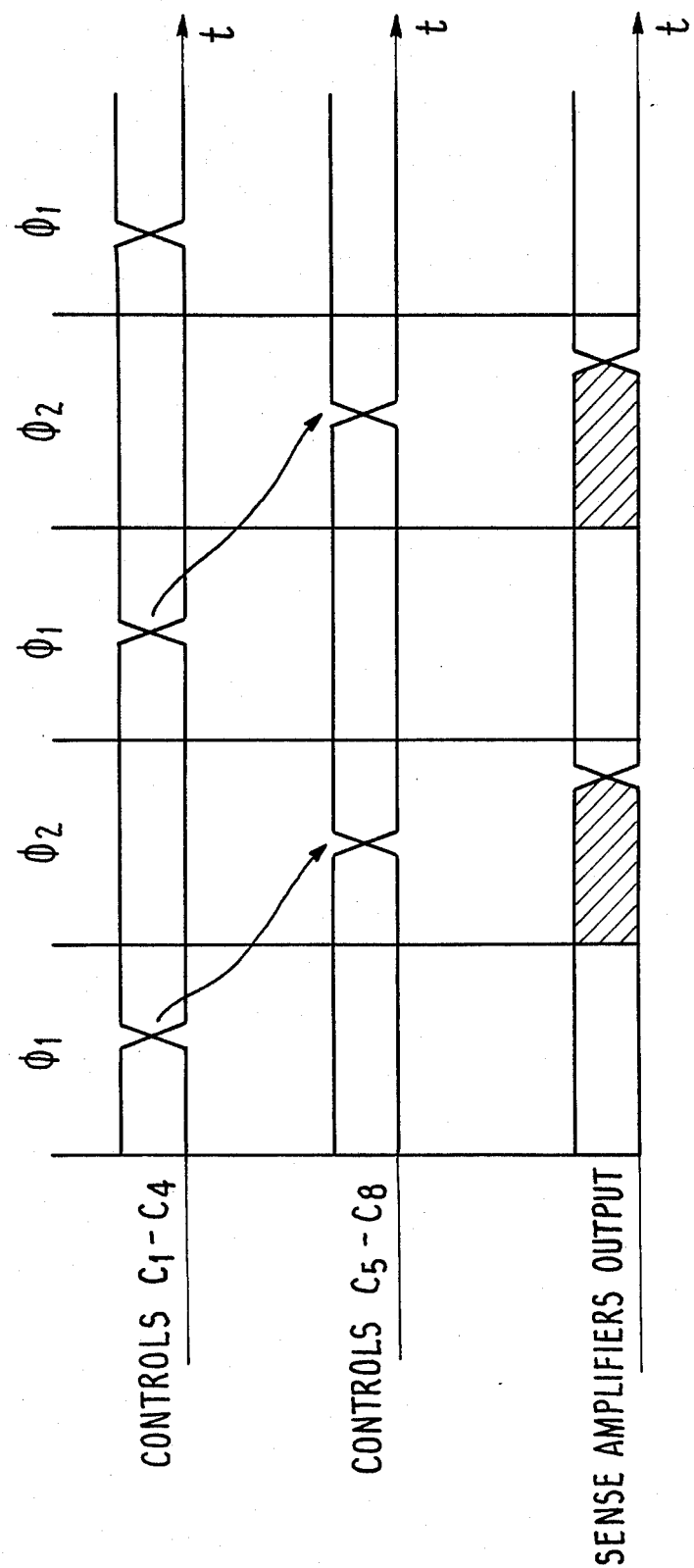
FIG. 2 is a timing diagram illustrating the control signals for the programmable sense amplifier shown in FIG 1.

As illustrated in FIG. 2, the programmable sense amplifier 10 is designed to work in a two-phase, nonoverlapping clock environment. During phase $\phi 1$, the ROM's columns, i.e. inputs IN1–IN4 of the sense amplifier, are precharged and turn off P-channel transistor T9. During this phase, one of the control signals C1–C4 is selected by an address decoder, a portion of which is shown in FIG. 3, and one of the transistors T1–T4 of multiplexer 12 is turned on.

Phase $\phi 2$ turns on one of the transistors T5–T8 of internal multiplexer 16. This transistor will then either charge or discharge select Node 2, which is connected to one of the inputs to the XOR gate, depending on whether it has been connected to the positive supply $V_{CC}$ or to the negative supply $V_{SS}$, respectively.

As shown in FIG. 1, transistors T5–T8 are controlled by control signals C5–C8, respectively. As shown in FIG. 3, control signals C5–C8 are derived from signals C1–C4. Signals C1–C4 obtain their true logic level during phase $\phi 1$ when the columns of the ROM are precharged and the sense amplifier is not active. Thus, signals C1–C4 are "active LOW", meaning that if, for example, signal C1 is chosen by the address decoder, then its voltage level will be low, while signals C2–C4 will be at a high voltage level. If signal C1 enables input signal IN1 to the sense amplifier's input, then, during phase $\phi 2$, signal C5 must determine whether the input IN1 will be inverted or not.

As shown in FIG. 1, transistors T5–T8 are "N" type transistors in the illustrated embodiment. Therefore, a positive voltage must be applied to the gate electrodes of these devices in order for them to conduct. FIG. 3 shows that if signal C1 is "LOW," then, during phase φ2, signal C5 will be "HIGH" and vice versa.

The reason that control signals C5–C8 do not change their voltage level together with signals C1–C4 is that, during phase φ1, the output of the sense amplifier 5 should be stable. The precharge process at the IN1–IN4 inputs shuts off transistor T9. However, if transistors T5–T8 were active during phase φ1, they could change the state of the output.

The phase φ1 and phase φ2 signals are generated by a clock buffer (not shown) and are non-overlapped. That is, when signal φ1 is "HIGH", signal φ2 is "LOW"; signal φ2 rises to "HIGH" only after signal φ1 is already "LOW", and vice versa. In this timing scheme, phase φ2 is the phase in which data is fetched from the ROM. Phase φ1 is used for a column precharging process, described below. The address to the ROM appears at the address decoder during phase 100 1. The connection of the phase φ1 signal to the ROM is illustrated in FIG. 4.

The control signals C1–C4 are arranged so that when transistor T1 operates during phase φ1, transistor T5 will operate during phase φ2. When transistor T2 operates during phase φ1, transistor T6 will operate during phase φ2. When transistor T3 operates during phase φ1, transistor T7 will operate during phase φ2. When transistor T4 operates during phase φ1, transistor T8 will operate during phase φ2. The portion of the address decoder that realizes this function is illustrated in FIG. 3.

For example, if in the above-described example when a ROM having 1024 rows of 40 bits is implemented as 256 "folded" rows of 160 bits, a ten bit address is required to choose one of the 1024 words stored in the ROM. Because there are four words in each row, two bits from the ROM address are required to choose which word is needed and eight bits are required to determine the row in which this word is located. The two column address bits are provided to the decoder as shown in FIG. 3.

For example, if transistor T5 is connected to the positive supply $V_{CC}$, the select Node 2 is charged during phase φ2 and the XOR gate, i.e. transistors T12–T14, does not invert the voltage level at Node 3. If transistor T5 is connected to the negative supply $V_{SS}$, Node 2 is discharged and the XOR gate inverts the voltage level at Node 3.

When transistor T10 is turned off at the end of phase φ2, transistor T9 and transistor T10 (which is turned off due to the precharge process that takes place at inputs IN1–IN4) sample and maintain the data at Node 1 until generation of the next phase φ2 signal.

Thus, for example, if the number of "1"s in the ROM column corresponding to input signal IN1 is greater than one-half of the number of rows in the ROM, then the contents of that column are inverted by replacing the "1"s with "0"s and the "0"s with "1"s. Simultaneously, transistor T5 is selectively connected to the negative supply $V_{SS}$ in order to produce the correct output.

FIG. 5 shows the NOT XOR gate in greater detail, where "A" is the input to inverter I4, "B" corresponds to Node 3 in FIG. 1, "C" is the output of invertor I2, and "E", which is the inversion of "C", i.e. E=NOT C, denotes the feedback signal from p-channel device T14 to the input of invertor I2. The truth table for the illustrated NOT XOR stage is as follows:

| B | C | A |
|---|---|---|
| 0 | 0 | 1 |
| 0 | 1 | 0 |
| 1 | 0 | 0 |
| 1 | 1 | 1 |

If column "C" is rearranged, then the resulting truth table is as follows:

| B | C | A |
|---|---|---|
| 0 | 0 | 1 |
| 1 | 0 | 0 |
| 0 | 1 | 0 |
| 1 | 1 | 1 |

Or, if "NB" denotes the compliment of "B," then

| B | C | A |
|---|---|---|
| 0 | 0 | NB |
| 1 | 0 | NB |
| 0 | 1 | B |
| 1 | 1 | B |

Thus, it can be seen that "C", which has the same logic level as Node 2 in FIG. 1, can control whether the output of the sense amplifier or its inversion will feed the output driver. Referring to FIG. 6, which shows the internal multiplexer 16, during the column counting phase of the ROM layout, transistors T5–T8 are connected to either the $V_{CC}$ or $V_{SS}$ supplies as follows. If a "1" appears in the ROM content, then a corresponding transistor should be similarly connected. Thus, when the ROM's content is a "1", a "HIGH" logic level is expected at the output of the sense amplifier. As shown in FIG. 7, the ROM transistor, the clocked sense and the amplifying stages invert the ROM's bit line content three times; the output driver adds a fourth inversion to the signal. Therefore, if a column was not inverted during the counting phase, then the internal multiplexer 16 should not invert the data, i.e., C=1 in FIG. 5. Therefore, those transistors in the internal multiplexer, the associated columns of which were not inverted, are connected to the $V_{CC}$ positive supply. Those transistors whose columns were inverted are connected to the $V_{SS}$ negative supply.

For example, in the "folded" ROM design referenced above, each sense amplifier "serves" four columns. Therefore, sixteen combinations relating to the inversion of the ROM's columns can appear at the inputs IN1–IN4 of each sense amplifier. After the first sense amplifier cell is layed out, fifteen more copies of it can be made, covering the sixteen possible combinations. The only difference between the cells is the different arrangement of the contacts that determine the state of the programmable internal multiplexer 16 for each column. Each cell has a corresponding binary number that represents the state of its inputs, the number corresponding to the polarity of the connection of the internal multiplexer that must be implemented to produce the correct sense amplifier output. In the case where none of the sense amplifier inputs IN1–IN4 was inverted, the binary number could be 1111 (15 decimal). During the counting stage, every column whose content was inverted is denoted as "1" and every column whose content was not inverted is denoted as "0". After the counting of four columns is completed, the combination of "1"s and "0"s determines the cell that should be used as the sense amplifier for these columns.

For a ROM with 4 bit width and 16 rows, and assuming that this ROM is "folded" as 16 bits and 4 rows, and the truth table before counting is as follows:

| 0 | 1 | 0 | 1 | 0 | 1 | 0 | 1 | 0 | 1 | 0 | 1 | 0 | 1 |
|---|---|---|---|---|---|---|---|---|---|---|---|---|---|
| 1 | 1 | 1 | 1 | 0 | 0 | 0 | 0 | 0 | 1 | 1 | 1 | 1 | 0 0 |
| 1 | 1 | 1 | 0 | 0 | 0 | 0 | 0 | 0 | 0 | 1 | 1 | 1 | 1 1 |
| 1 | 1 | 1 | 1 | 1 | 1 | 1 | 1 | 1 | 1 | 1 | 1 | 1 | 1 1 |

If the columns with more than 2 "1"s are denoted by 0 and those columns with less than 2 "1"s are denoted by 1, then the following results:

| 0 | 0 | 0 | 0 | 1 | 1 | 1 | 1 | 1 | 1 | 1 | 0 | 0 | 0 | 1 0 |
|---|---|---|---|---|---|---|---|---|---|---|---|---|---|---|
| 0 | 1 | 0 | 1 | 0 | 1 | 0 | 1 | 0 | 1 | 0 | 1 | 0 | 1 | |
| 1 | 1 | 1 | 1 | 0 | 0 | 0 | 0 | 0 | 1 | 1 | 1 | 1 | 0 0 | |
| 1 | 1 | 1 | 0 | 0 | 0 | 0 | 0 | 0 | 0 | 1 | 1 | 1 | 1 1 | |
| 1 | 1 | 1 | 1 | 1 | 1 | 1 | 1 | 1 | 1 | 1 | 1 | 1 | 1 1 | |

Following inversion of the columns, the table is as follows:

| 0 | 0 | 0 | 0 | 1 | 1 | 1 | 1 | 1 | 1 | 0 | 0 | 0 | 1 0 |
|---|---|---|---|---|---|---|---|---|---|---|---|---|---|
| 1 | 0 | 1 | 0 | 0 | 1 | 0 | 1 | 0 | 1 | 0 | 0 | 1 | 0 0 0 |
| 0 | 0 | 0 | 0 | 1 | 0 | 0 | 0 | 0 | 0 | 1 | 0 | 0 | 0 0 1 |
| 0 | 0 | 0 | 1 | 0 | 0 | 0 | 0 | 0 | 0 | 0 | 0 | 0 | 1 0 |
| 0 | 0 | 0 | 0 | 1 | 1 | 1 | 1 | 1 | 1 | 1 | 0 | 0 | 0 1 0 |

Thus, the cell that will be used as sense amplifiers for these columns will be:
cell number 1111=15
cell number 0000=0
cell number 0010=2
cell number 1110=14

It should be understood that various alternatives to the embodiment of the invention described herein may be employed in practicing the invention. It is intended that the following claims define the scope of the invention and that circuit structures within the scope of these claims and their equivalents be covered thereby.

What is claimed is:

1. A programmable sense amplifier for a read only memory (ROM) comprising:
   (a) an input multiplexer which receives a plurality of data input signals from a like plurality of column lines of the ROM and provides a selected one of the data input signals as a data output signal, the voltage level of the data output signal corresponding to the number of "1"s contained in the selected column line, the contents of the selected column line having been inverted if the number of "1"s contained in the data to be stored in the column line exceeds one-half the total number of ROM row lines;
   (b) a sensing stage which amplifies the data output signal to provide a sensing stage output signal;
   (c) inverter means for inverting the sensing stage output signal upon receipt of an invert signal; and
   (d) programmable means selectively connected to a voltage source to provide the invert signal if the contents of the selected column line have been inverted.

2. A programmable sense amplifier for a read only memory (ROM) comprising:
   (a) an input multiplexer which receives a plurality of data input signals from a like plurality of column lines of the ROM and provides a selected one of the data input signals as a data output signal based on control signals provided to the input multiplexer, the voltage level of the data output signal corresponding to the number of 1's contained in the column line corresponding to the selected data signal;
   (b) a sensing stage which amplifies the data output signal to provide a sensing stage output signal;
   (c) inverter means which either does or does not invert the sensing stage output signal, based upon the state of a select node to which one of the inputs to said inverter means is connected; and
   (d) a programmable internal multiplexer which determines the state of the select node, the internal multiplexer comprising a plurality of FET switching transistors, each of the FET switching transistors having one of its source/drain areas commonly-connected to the select node and its other source/drain area selectively connected to either a positive supply voltage or a negative supply voltage, the connection to the negative supply voltage being selected if the number of 1's contained in the selected ROM column exceeds one-half the total number of ROM row lines, the connection to the positive supply being selected if the number of 1's contained in the selected ROM column does not exceed one-half of the total number of ROM row lines, the 1's and 0's in the selected column line having been inverted prior to programming if the number of 1's in an original word to be programmed into the selected column line exceeds one-half the total number of ROM row lines.

* * * * *

UNITED STATES PATENT AND TRADEMARK OFFICE
CERTIFICATE OF CORRECTION

PATENT NO. : 4,821,239

DATED : April 11, 1989

INVENTOR(S) : Lavi A. Lev

It is certified that error appears in the above-identified patent and that said Letters Patent is hereby corrected as shown below:

In the Abstract, first line second column, "proviced" should read -- provided --.

Column 5, line 18, "100 1" should read --$\phi$1--.

Signed and Sealed this

Twenty-first Day of November, 1989

Attest:

JEFFREY M. SAMUELS

*Attesting Officer*     *Acting Commissioner of Patents and Trademarks*